United States Patent [19]

Kawata

[11] Patent Number: 4,825,414
[45] Date of Patent: Apr. 25, 1989

[54] SEMICONDUCTOR INTEGRATED CIRCUIT DEVICE HAVING GATE ARRAY AND MEMORY AND INPUT-OUTPUT BUFFER

[75] Inventor: Mitsuya Kawata, Yokohama, Japan

[73] Assignee: Fujitsu Limited, Kanagawa, Japan

[21] Appl. No.: 210,966

[22] Filed: Jun. 24, 1988

[30] Foreign Application Priority Data

Jun. 30, 1987 [JP] Japan .................................. 62-163542

[51] Int. Cl.⁴ ......................... G11C 7/00; G11C 11/40
[52] U.S. Cl. .................................... 365/189; 365/201; 307/465
[58] Field of Search ................ 365/201, 189; 307/465; 364/490

[56] References Cited

U.S. PATENT DOCUMENTS

| | | | |
|---|---|---|---|
| 4,608,669 | 8/1986 | Klara et al. ........................ | 365/201 |
| 4,617,479 | 10/1986 | Hartmann et al. .................. | 307/465 |
| 4,691,161 | 9/1987 | Kant et al. ......................... | 307/465 X |
| 4,697,241 | 9/1987 | Lavi ................................. | 307/465 X |
| 4,724,531 | 2/1988 | Angleton et al. ................... | 307/465 X |
| 4,736,395 | 4/1988 | Sugihara .......................... | 307/291 X |
| 4,742,490 | 5/1988 | Hoffmann .......................... | 365/201 |
| 4,758,476 | 7/1988 | Birkner ............................. | 307/465 |
| 4,768,167 | 8/1988 | Yoder ............................... | 365/201 X |

Primary Examiner—Stuart N. Hecker
Assistant Examiner—Alyssa H. Bowler
Attorney, Agent, or Firm—Armstrong, Nikaido, Marmelstein, Kubovcik & Murray

[57] ABSTRACT

A semiconductor integrated circuit device has a normal mode and a test mode for testing a memory thereof, and comprises input/output buffer parts having input/output terminals, at least one gate array, at least one memory, a first interconnection for coupling the input/output buffer parts, the gate array and the memory and routed depending on a logic operation to be carried out by the semiconductor integrated circuit, and a second interconnection for coupling the input/output buffer parts, the gate array and the memory, where the second interconnection is fixed regardless of the logic operation to be carried out by the semiconductor integrated circuit. The input/output buffer parts comprise a first input/output part having a first terminal which is used in common as an input terminal of the first interconnection for receiving a normal input signal in the normal mode and an input terminal of the second interconnection for receiving a test signal in the test mode, and a second input/output part having a second terminal which is used in common as an output terminal of the first interconnection and an output terminal of the second interconnection.

6 Claims, 5 Drawing Sheets

SEMICONDUCTOR INTEGRATED CIRCUIT DEVICE HAVING GATE ARRAY AND MEMORY AND INPUT-OUTPUT BUFFER

BACKGROUND OF THE INVENTION

The present invention generally relates to semiconductor integrated circuit devices, and more particularly to a semiconductor integrated circuit device having a gate array and a memory and provided with a function of testing the memory.

In order to improve the reliability of the semiconductor integrated circuit device, the manufacturer of the semiconductor integrated circuit device tests the memory thereof before forwarding the semiconductor integrated circuit device to the user. Hence, the semiconductor integrated circuit device is provided with a memory testing circuit for testing the memory of the semiconductor integrated circuit. It is also possible for the user to test the memory by use of the memory testing circuit, and further, the memory testing circuit can in some cases be used to totally clear the contents of the memory.

When providing such a memory testing circuit in the semiconductor integrated circuit devices, it is desirable that the number of input/output pins for supporting the memory testing function is extremely small and that an interconnection (or wiring) region is effectively utilized without the need to draw the interconnection around wastefully.

FIG.1 generally shows the conventional semiconductor integrated circuit device having the memory testing function. The semiconductor integrated circuit device comprises gate arrays 1 and 2, a random access memory (RAM) 3, normal signal input terminals 4, test signal input terminals 5, and output terminals 6. There are two kinds of interconnection coupling the gate array 1, the RAM 3 and the gate array 2, namely, a first interconnection of a normal signal system and a second interconnection of a test signal system. Both the first and second interconnections are formed during an interconnection pattern forming process by automatically designing the interconnection layout pattern using the computer aided design (CAD) technique. In other words, both the first and second interconnections are designed for each kind or model of the semiconductor integrated circuit device depending on a logic circuit constituted by the gate array.

In a normal mode, normal signals such as an address signal, a block select signal, a write-enable signal and a normal input data are supplied to the normal signal input terminals 4. The normal input data is supplied to the RAM 3 through the gate array 1 and is written into a memory cell array of the RAM 3 responsive to the write-enable signal from a block selected by the block select signal. A normal output data read out from the RAM 3 is obtained through the gate array 2 and is outputted from the output terminals 6.

In a test mode, test signals such as an address signal, a block select signal, a write-enable signal and a test input data are supplied to the test signal input terminals 5. The test input data are supplied to the RAM 3 through the gate array 1 and is written into memory cell array of the RAM 3 responsive to the write-enable signal from a block selected by the block select signal. A test output data read out from the RAM 3 is obtained through the gate array 2 and is outputted from the output terminals 6. It is impossible to check the state of the RAM 3 from the test output data outputted from the output terminals 6.

According to this conventional semiconductor integrated circuit device, the normal signal input terminals 4 and the test signal input terminals 5 are provided independently, thereby resulting in a large number of input/output pins. For this reason, the number of input/output pins originally for use with the gate array is reduced because of the need to provide independent input/output pins for supporting the memory testing function. Hence, there is a problem in that the gate arrays 1 and 2 cannot be utilized effectively.

On the other hand, the second interconnection of the test signal system is designed automatically depending on the first interconnection of the normal signal system which is designed automatically. As a result, the second interconnection is dependent on the kind or model of the semiconductor integrated circuit device, and the second interconnection must be designed for each kind or model of the semiconductor integrated circuit. Therefore, there are problems in that the interconnection must be drawn around wastefully and that it takes a long time to design and manufacture the semiconductor integrated circuit device.

Furthermore, because the second interconnection of the test signal system differs for each kind or model of the semiconductor integrated circuit, the propagation time of the test signal differs for each kind or model when testing the RAM of the semiconductor integrated circuit. Thus, there is a problem in that an evaluation test such as evaluating the access time of the RAM cannot be carried out uniformly with respect to the different kinds or models of the semiconductor integrated circuit.

SUMMARY OF THE INVENTION

Accordingly, it is a general object of the present invention to provide a novel and useful semiconductor integrated circuit device in which the problems described heretofore are eliminated.

Another and more specific object of the present invention is to provide a semiconductor integrated circuit device having a memory testing function, in which a number of input/output pins is small, an interconnection is not drawn around wastefully, and the designing and manufacturing of the semiconductor integrated circuit device is facilitated.

Still another object of the present invention is to provide a semiconductor integrated circuit device having a normal mode and a test mode for testing a memory thereof, and comprises input/output buffer parts having input/output terminals, at least one gate array, at least one memory, a first interconnection for coupling the input/output buffer parts, the gate array and the memory and routed depending on a logic operation to be carried out by the semiconductor integrated circuit, and a second interconnection for coupling the input/output buffer parts, the gate array and the memory, where the second interconnection is fixed regardless of the logic operation to be carried out by the semiconductor integrated circuit. The input/output buffer parts comprise a first input/output part having a first terminal which is used in common as an input terminal of the first interconnection for receiving a normal input signal in the normal mode and an input terminal of the second interconnection for receiving a test signal in the test mode, and a second input/output part having a second terminal which is used in common as an output terminal of the first interconnection and an output terminal of the second interconnection.

Other objects and further features of the present invention will be apparent from the following detailed description when read in conjunction with the accompanying drawings.

DETAILED DESCRIPTION

Figure 1:
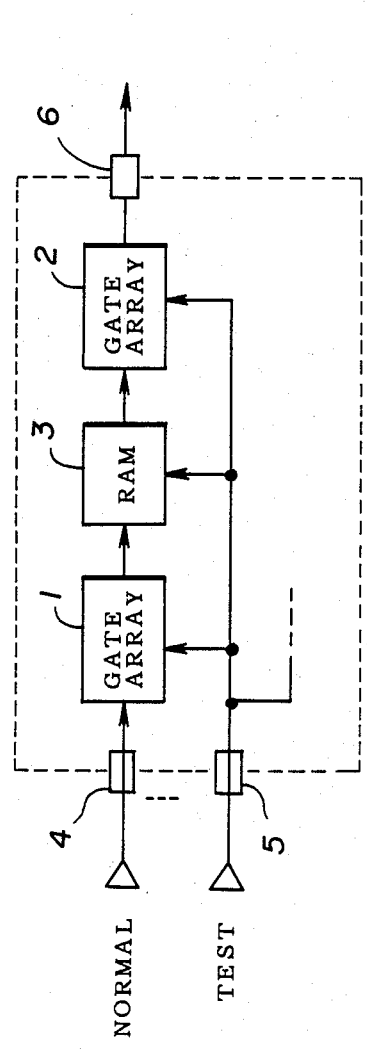
FIG. 1 is a system block diagram generally showing an example of the conventional semiconductor integrated circuit device.
Figure 2:
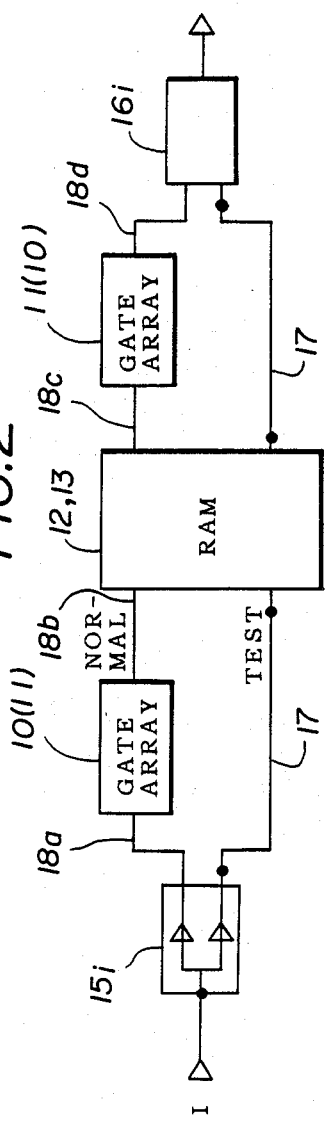
FIG. 2 is a system block diagram generally showing an embodiment of the semiconductor integrated circuit device according to the present invention.

FIG. 2 generally shows an embodiment of the semiconductor integrated circuit device according to the present invention. The semiconductor integrated circuit device comprises gate arrays 10 and 11, RAMs 12 and 13, input/output parts 15$i$ and 16$i$ including input/output pins and input/output buffers, interconnections 17 of a test signal system, and interconnections 18$a$ through 18$d$ of a normal signal system. The input/output pins of the input/output parts 15$i$ and 16$i$ are used in common as input/output terminals of the interconnections 17 of the test signal system and input/output terminals of the interconnections 18$a$ and 18$d$ of the normal signal system. The interconnections 17 are fixed, while the interconnections 18$a$ through 18$d$ are formed during an interconnection pattern forming process by automatically designing the interconnection layout pattern using the computer aided design (CAD) technique. In other words, the routing of the interconnections 18$a$ through 18$d$ are different for each kind or model of the semiconductor integrated circuit device depending on the logic operation to be carried out by the semiconductor integrated circuit device, while the interconnections 17 are fixed regardless of the kind or model of the semiconductor integrated circuit device.

According to the present embodiment, it is possible to reduce the number of input/output pins compared to the conventional device because the same input/outut pins are used in common as the input/output terminals of the interconnections 17 and the input/output terminals of the interconnections 18$a$ and 18$d$. In addition, an interconnection (or wiring) region is effectively utilized without the need to draw the interconnection around wastefully since the interconnections 17 of the test signal system are fixed. Accordingly, semiconductor integrated circuit device can be designed and manufactured with ease without taking a long period of time. In addition, since the interconnections 17 of the test signal system are the same for each kind or model of the integrated circuit device, an evaluation test of the RAM of the integrated circuit device can be carried out uniformly with respect to the different kinds or models of the integrated circuit device.

Figure 3:
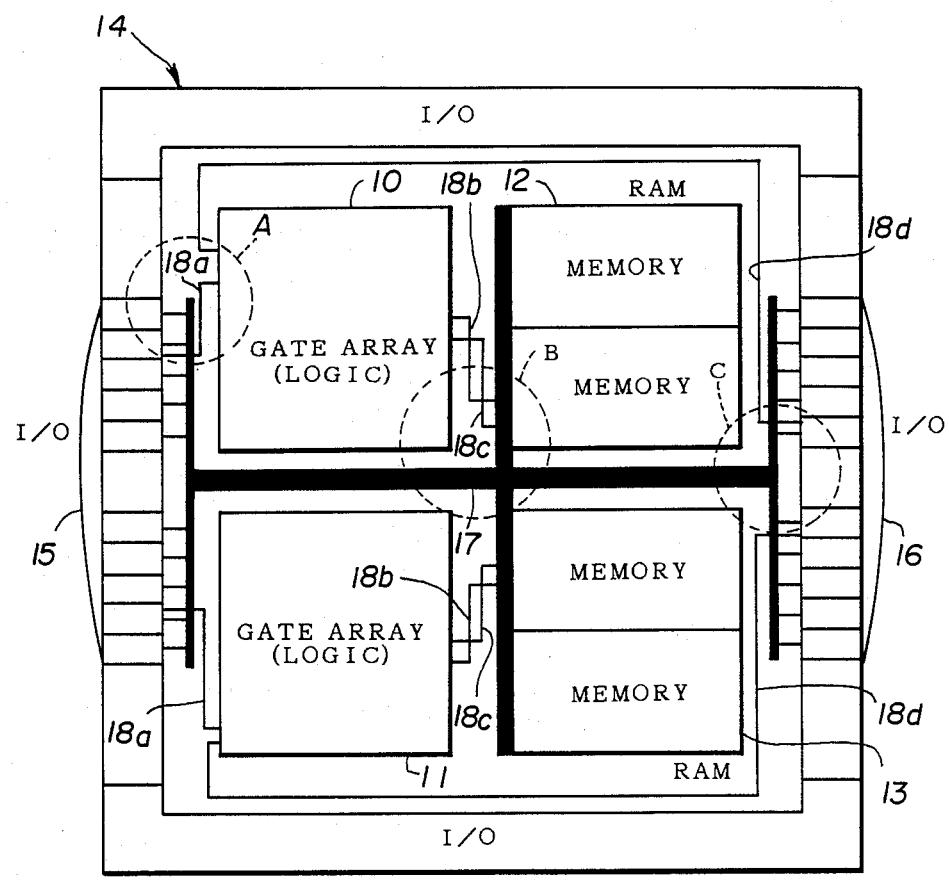
FIG. 3 is a plan view showing interconnections of the device shown in FIG.2.

FIG.3 shows the interconnections of the embodiment shown in FIG. 2. FIG. 3 shows the semiconductor integrated circut device in the form of a chip, and mainly shows the fixed interconnections of the test signal system. In FIG.3, those parts which are the same as those corresponding parts in FIG.2 are designated by the same reference numerals, and a description thereof will be omitted.

The semiconductor integrated circuit device comprises an input/output terminal region 14, and input/output buffer parts 15 and 16 having input/output parts provided in the input/output terminal region 14. The input /output parts have input/output terminals (input/output pins) and input/output buffers. The fixed interconnections 17 of the test signal system are indicated by bold lines, and these fixed interconnections 17 are fixed regardless of the kind or model of the semiconductor integrated circuit device. The interconnections 18$a$ through 18$d$ of the normal signal system are formed in interconnection regions other than the interconnection regions of the fixed interconnections 17 in correspondence with the kind or model of the semiconductor integrated circuit device. The interconnections 18$a$ couple the gate arrays 10 and 11 to the input/outut buffer part 15. The interconnections 18$b$ and 18$c$ couple the gate arrays 10 and 11 to the RAMs 12 and 13. In addition, the interconnections 18$d$ couple the gate arrays 10 and 11 to the input/output buffer part 16. The fixed interconnections 17 couple directly to the RAMs 12 and 13 without being routed through the gate arrays 10 and 11.

As will be described later, input terminals of the fixed interconnections 17 and input terminals of the interconnections 18$a$ are used in common at the input/output terminals of the input/output parts of the input/output buffer part 15. Similarly, output terminals of the fixed interconnections 17 and output terminals of the interconnection 18$d$ are used in common at the input/output terminals of the input/output parts of the input/output buffer part 16.

Figure 4A:
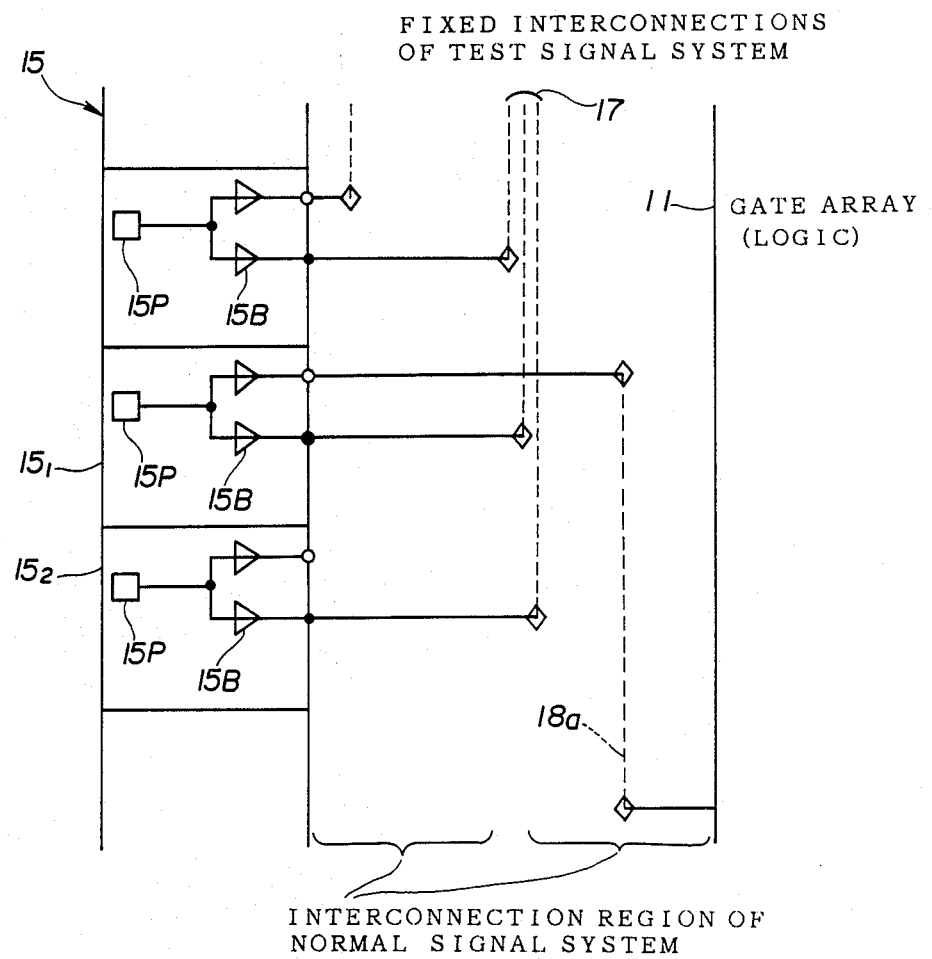
FIGS. 4A through 4C are plan views on an enlarged scale respectively showing the interconnections at predetermined regions of the device shown in FIG.3.
Figure 4B:
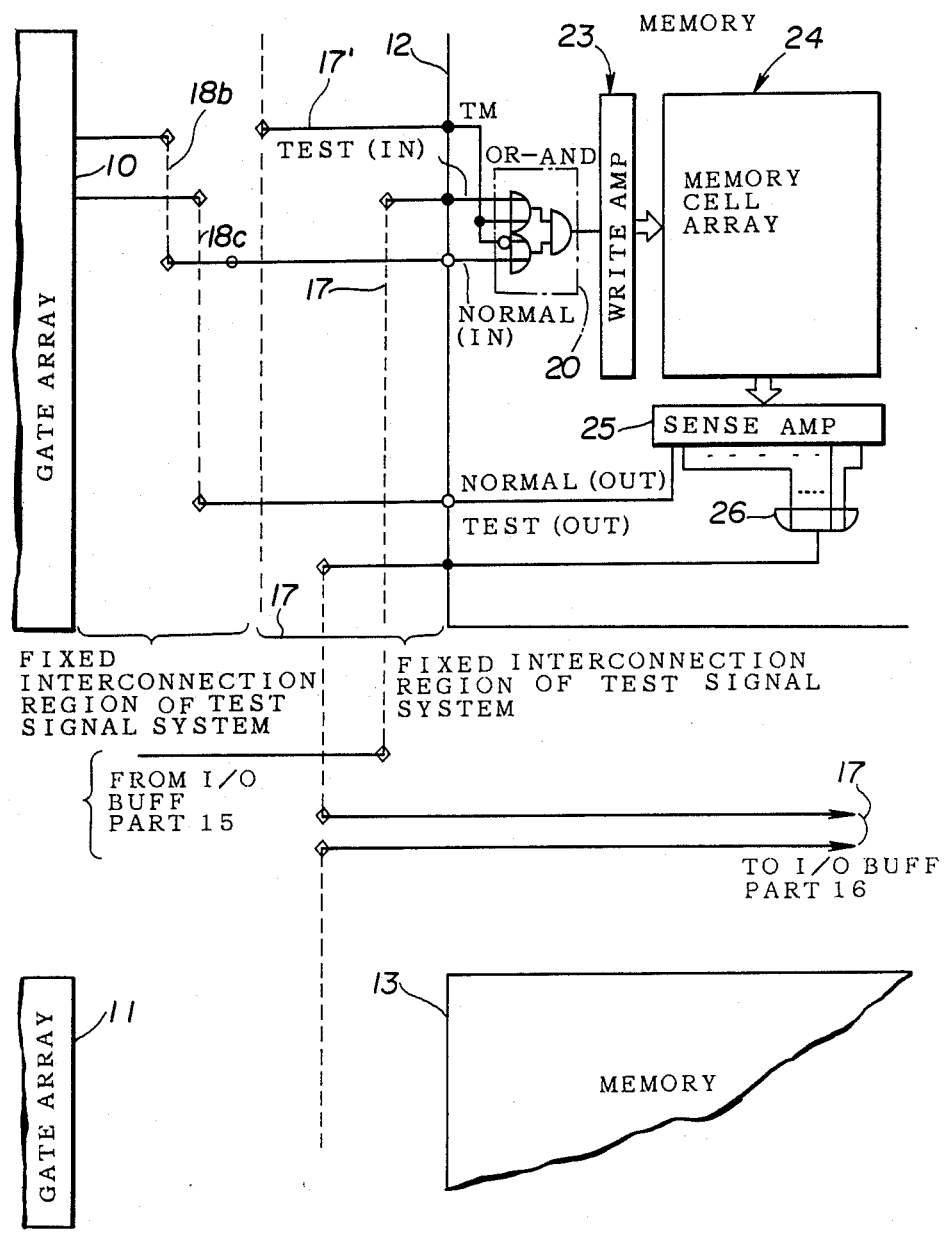
Figure 4C:
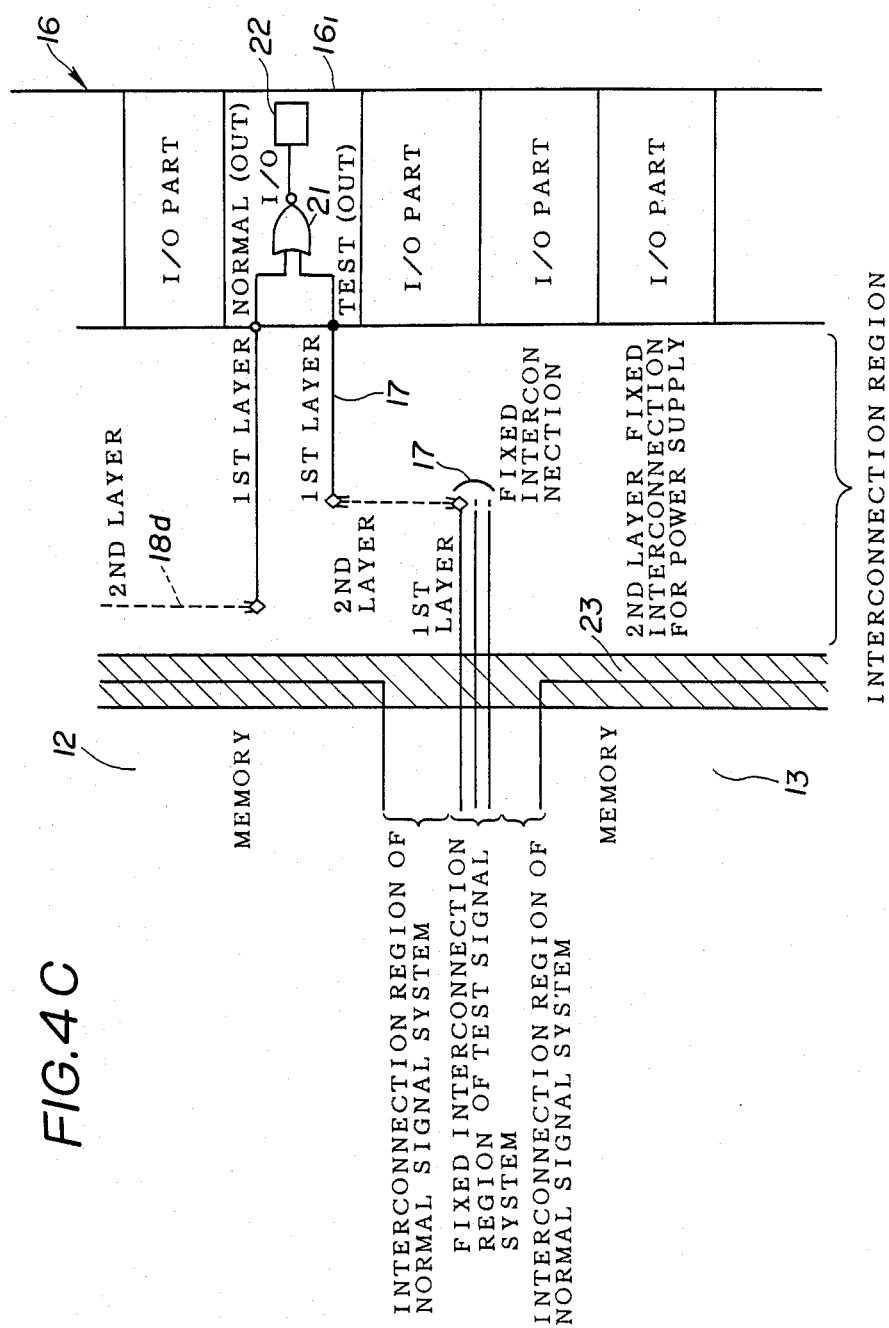

FIGS.4A through 4C respectively show on an enlarged scale the interconnections at predetermined regions A through C of the semiconductor integrated circuit device encircled by phantom lines in FIG.3. In FIGS.4A through 4C, a black circular mark indicates a terminal of the test signal system, a white circular mark indicates a terminal of the normal signal system, a solid line indicates a first layer interconnection, a phantom line indicates a second layer interconnection, and a white rhombic mark indicates a connection point for connecting the first and second layer interconnections.

In FIG.4A, the input/output buffer part 15 is made up of input/output parts 15$_1$, 15$_2$, . . . each comprising an input/output terminal 15P and input/output buffers 15B. The fixed interconnections 17 of the test signal drawn out from each of the input/output parts 15$_1$, 15$_2$, . . . are provided within an interconnection region without being routed through the gate array 11. In addition, the interconnections 18$a$ of the normal signal system drawn out from each of the input/output parts 15$_1$, 15$_2$, . . . are provided within interconnection regions other than the interconnection regions of the fixed interconnections 17 and are coupled to the gate array 11. In this case, input terminals of the fixed interconnections 17 and the interconnections 18$a$ are used in common at the one of the input/output parts 15$_1$, 15$_2$, . . . constituting the input/output buffer part 15.

In FIG.4B, the fixed interconnections 17 drawn out from the input/output buffer part 15 couple to the RAM 12, while the fixed interconnections 17 drawn out from the RAM 12 couple to the input/output buffer part 16. The interconnections 18$b$ and 18$c$ drawn out from the gate array 10 are provided within an interconnection region other than the interconnection region of the fixed interconnections 17 and couple to the RAM 12. The interconnection regions of the test signal system and the normal signal system are provided in the first layer interconnection layer and the second layer interconnection layer.

The RAM 12 generally comprises an OR-AND circuit 20, a write amplifier 23, a memory cell array 24, a sense amplifier 25 and an OR circuit 26. The OR-AND circuit 20 is a switching gate for switching the mode of the RAM 12 to a test mode when supplied with a low-level mode switching signal TM from a fixed interconnection 17' of a mode switching signal system out of the fixed interconnections 17 and to a normal mode when supplied with a high-level mode switching signal TM, for example.

In FIG. 4B, NORMAL(IN) and NORMAL(OUT) respectively denote input and output signals of the RAM 12 in the normal mode, and TEST(IN) and TEST(OUT) respectively denote input and output test signals of the RAM 12 in the test mode.

In FIG. 4C, the input/output buffer part 16 is made up of input/output parts $16_1$, . . . each comprising a NOR circuit 21 and a pad 22. The interconnection 18$d$ drawn out from the gate array 10 and the fixed interconnection 17 drawn out from the RAM 12 are coupled to the NOR circuit 21 of the input/output part $16_1$ and accordingly couples to the pad 22 thereof. A power source line 23 is provided as a second layer fixed interconnection for supplying a power source voltage to each part of the semiconductor integrated circuit.

Therefore, according to the present embodiment, a single input/output pin is used in common as the input terminals of the test signal system and the normal signal system, and the normal signal and the test signal can be obtained from the single input/output pin. Moreover, the interconnections of the test signal system are fixed interconnections while the interconnections of the normal signal system are formed by automatically designing the interconnection layout pattern using the computer aided design (CAD) technique. Hence, the fixed interconnections of the test signal system are the same regardless of the kind or model of the semiconductor integrated circuit device, and only the interconnections of the normal signal system need to be designed for each kind or model of the semiconductor integrated circuit device depending on the logic operation to be carried out by the semiconductor integrated circuit device, thereby considerably facilitating the designing and manufacturing of the semiconductor integrated circuit device.

The described embodiment has two gate arrays and two RAMS. However, it is of course possible to provide only one gate array and only one RAM, or provide three or more gate arrays and three or more RAMS depending on the needs.

Further, the present invention is not limited to these embodiments, but various variations and modifications may be made without departing from the scope of the present invention.

What is claimed is:

1. A semiconductor integrated circuit device having a normal mode and a test mode for testing a memory thereof, said semiconductor integrated circuit device comprising:
    input/output buffer parts having input/output terminals;
    at least one gate array;
    at least one memory;
    a first interconnection for coupling said input/output buffer parts, said gate array and said memory, said first interconnection being routed depending on a logic operation to be carried out by said semiconductor integrated circuit; and
    a second interconnection for coupling said input/output buffer parts, said gate array and said memory, said second interconnection being fixed regardless of the logic operation to be carried out by said semiconductor integrated circuit,
    said input/output bufer parts comprising a first input/output part having a first terminal which is used in common as an input terminal of said first interconnection for receiving a normal input signal in the normal mode and an input terminal of said second interconnection for receiving a test signal in the test mode, and a second input/output part having a second terminal which is used in common as an output terminal of said first interconnection and an output terminal of said second interconnection.

2. A semiconductor integrated circuit device as claimed in claim 1 in which said first interconnection is provided in an interconnection region different from an interconnection region in which said second interconnection is provided.

3. A semiconductor integrated circuit device as claimed in claim 1 which comprises a plurality of gate arrays and memories.

4. A semiconductor integrated circuit device as claimed in claim 1 in which said first input/output part further comprises buffers for respectively supplying the input signal received by the first terminal to the first interconnection and the test signal received by the first terminal to the second interconnection.

5. A semiconductor integrated circuit device as claimed in claim 1 in which said second input/output part further comprises a NOR circuit supplied with output signals of said first and second interconnections for supplying an output signal thereof to the second terminal.

6. A semiconductor integrated circuit device as claimed in claim 1 in which said memory is a random access memory.

* * * * *